United States Patent
Tanaka

(10) Patent No.: US 9,856,868 B2
(45) Date of Patent: Jan. 2, 2018

(54) PIEZOELECTRIC FAN

(71) Applicant: Murata Manufacturing Co., Ltd., Nagaokayo-shi, Kyoto-fu (JP)

(72) Inventor: Nobuhira Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 4 days.

(21) Appl. No.: 14/449,373

(22) Filed: Aug. 1, 2014

(65) Prior Publication Data

US 2014/0341762 A1 Nov. 20, 2014

Related U.S. Application Data

(63) Continuation of application No. PCT/JP2013/051242, filed on Jan. 23, 2013.

(30) Foreign Application Priority Data

Feb. 13, 2012 (JP) .................. 2012-028000

(51) Int. Cl.
*H01L 41/09* (2006.01)
*F04B 43/04* (2006.01)
*F04D 33/00* (2006.01)

(52) U.S. Cl.
CPC ............ *F04B 43/046* (2013.01); *F04D 33/00* (2013.01); *H01L 41/094* (2013.01)

(58) Field of Classification Search
CPC ............. F04D 33/00; H01L 2924/0002; H01L 23/467; H01L 41/094; F04B 43/046
USPC ........ 417/410.1; 310/330, 331; 318/116, 119
See application file for complete search history.

(56) References Cited

U.S. PATENT DOCUMENTS

| 4,536,674 A | * | 8/1985 | Schmidt .................. F03D 5/00 310/330 |
| 4,595,338 A | * | 6/1986 | Kolm .................... F04D 33/00 310/330 |
| 5,003,324 A | | 3/1991 | Yoshiike et al. |
| 2011/0005733 A1 | | 1/2011 | Wada et al. |

(Continued)

FOREIGN PATENT DOCUMENTS

| JP | 62273784 A | * | 11/1987 |
| JP | 01-133756 A | | 5/1989 |
| JP | 02-033500 A | | 2/1990 |

(Continued)

OTHER PUBLICATIONS

English Abstract for JP2008274902A dated Nov. 13, 2008.*

(Continued)

*Primary Examiner* — Nathan Zollinger
(74) *Attorney, Agent, or Firm* — Keating & Bennett, LLP

(57) ABSTRACT

A piezoelectric fan includes a vibrating plate including blades and a base that are integral. Piezoelectric elements are mounted on the blade on the side of the base. Piezoelectric elements are mounted on the blade on the side of the base. Piezoelectric elements are mounted on the blade on the side of the base. Support bodies are disposed such that the base of the vibrating plate is sandwiched therebetween. A portion of each of the piezoelectric elements is sandwiched between the vibrating plate and the support plate, and a portion of each of the piezoelectric elements is sandwiched between the vibrating plate and the support plate.

17 Claims, 7 Drawing Sheets

(56) References Cited

U.S. PATENT DOCUMENTS

2011/0014069 A1    1/2011   Wada et al.
2013/0037245 A1    2/2013   Tanida et al.

FOREIGN PATENT DOCUMENTS

| | | | | |
|---|---|---|---|---|
| JP | 3-35298 U | | 4/1991 | |
| JP | 2008274902 A | * | 11/2008 | |
| JP | 2009081270 A | * | 4/2009 | |
| JP | 2009094414 A | * | 4/2009 | |
| JP | 2009/119431 A1 | | 10/2009 | |
| WO | WO 9618823 A1 | * | 6/1996 | ............ F04D 33/00 |
| WO | 2009/116455 A1 | | 9/2009 | |
| WO | 2011/027704 A1 | | 3/2011 | |

OTHER PUBLICATIONS

English Abstrcat for JP62273784A dated Nov. 27, 1987.*
Machine translation of JP62273784A description dated Nov. 27, 1987.*
Official Communication issued in International Patent Application No. PCT/JP2013/051242, dated May 7, 2013.

* cited by examiner

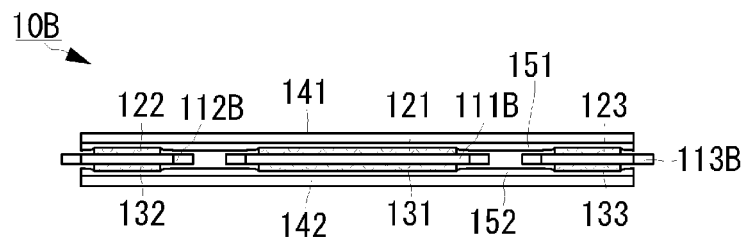
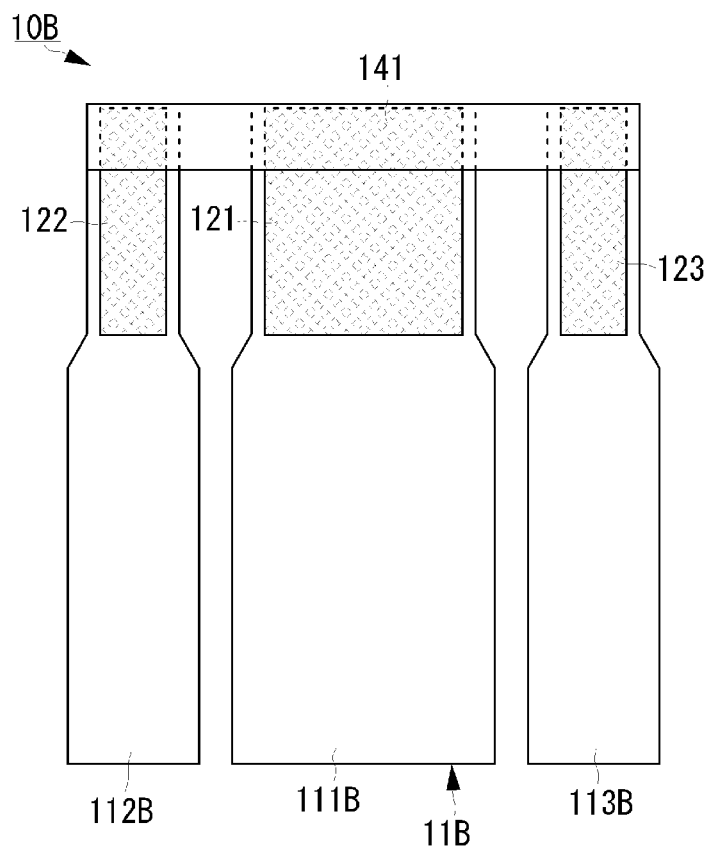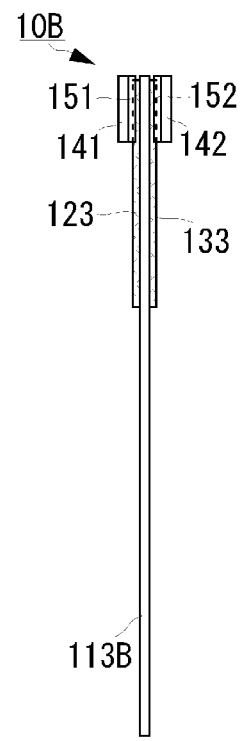

PIEZOELECTRIC FAN

BACKGROUND OF THE INVENTION

1. Field of the Invention

The present invention relates to a piezoelectric fan that blows air by using a piezoelectric element as a driving source and causing blades to vibrate.

2. Description of the Related Art

In the related art, as described in Japanese Unexamined Utility Model Registration Application Publication No. 3-35298, a piezoelectric fan that blows air by driving a piezoelectric element that is disposed on a blade, which has a flat plate-like shape, so as to cause the blade to vibrate has been designed.

FIG. 7A is an external perspective view of a piezoelectric fan 10P of the related art described in Japanese Unexamined Utility Model Registration Application Publication No. 3-35298, FIG. 7B is a plan view of the piezoelectric fan 10P, and FIG. 7C is a side view of the piezoelectric fan 10P.

The piezoelectric fan 10P includes a vibrating plate 11, piezoelectric elements 121P, 122P, 123P, 131P, 132P, and 133P, and support bodies 141 and 142. Note that, in FIG. 7, the piezoelectric elements 131P and 132P are not illustrated.

The vibrating plate 11 includes three blades 111, 112, and 113 and a base 110. The three blades 111, 112, and 113 and the base 110 are integrally formed. The blades 111, 112, and 113 are arranged along the longitudinal direction of the base 110 in the order of the blade 112, the blade 111, and the blade 113.

The piezoelectric element 121P is disposed on one of flat plate surfaces of the blade 111, and the piezoelectric element 131P is disposed on the other one of the flat plate surfaces of the blade 111. The piezoelectric element 122P is disposed on one of flat plate surfaces of the blade 112, and the piezoelectric element 132P is disposed on the other one of the flat plate surfaces of the blade 112. The piezoelectric element 123P is disposed on one of flat plate surfaces of the blade 113, and the piezoelectric element 133P is disposed on the other one of the flat plate surfaces of the blade 113.

The vibrating plate 11, which has such a configuration, is supported by being sandwiched by the support bodies 141 and 142 on the two flat plate surfaces, from the both sides of the base 110. In this case, the support bodies 141 and 142 are arranged in such a manner that an end surface of each of the piezoelectric elements 121P, 122P, 123P, 131P, 132P, and 133P and an end surface of a corresponding one of the support bodies 141 and 142 are in contact with each other.

In the piezoelectric fan 10P, the polarization direction of each of the piezoelectric elements 121P, 122P, 123P, 131P, 132P, and 133P and the direction of an applied voltage are set in such a manner that the blade 111 that is positioned in the middle in an array direction and the blades 112 and 113 that are positioned at either side in the array direction vibrate with opposite phases. Performing setting in this way allows vibration from the blade 111, which is positioned in the middle, and vibrations from the blades 112 and 113, which are positioned at either side in the array direction, to cancel each other out on the support bodies 141 and 142. Consequently a vibration in the support bodies 141 and 142 is suppressed.

However, in the piezoelectric fan 10P, which has the configuration described in Japanese Unexamined Utility Model Registration Application Publication No. 3-35298, the following problems occur. FIG. 8 is an enlarged plan view for describing problems concerning the piezoelectric fan 10P, which has the configuration described in Japanese Unexamined Utility Model Registration Application Publication No. 3-35298

In the piezoelectric fan 10P described in Japanese Unexamined Utility Model Registration Application Publication No. 3-35298, as described above, the support bodies 141 and 142 are arranged such that the end surface of each of the piezoelectric elements 121P, 122P, 123P, 131P, 132P, and 133P and the end surface of the corresponding one of the support bodies 141 and 142 are in contact with each other. However, in practice, a gap may sometimes be generated between the end surface of each of the piezoelectric elements 121P, 122P, 123P, 131P, 132P, and 133P and the end surface of the corresponding one of the support bodies 141 and 142 due to errors in mounting the piezoelectric elements 121P, 122P, 123P, 131P, 132P, and 133P and the support bodies 141 and 142 onto the vibrating plate 11 or the like.

For example, as illustrated in FIG. 8, there is a case where a gap Gap1 is generated between the piezoelectric element 121P and the support body 141, a gap Gap2 is generated between the piezoelectric element 122P and the support body 141, and a gap Gap3 is generated between the piezoelectric element 123P and the support body 141. In this case, the resonant frequencies of the blades 111, 112, and 113 will be different from one another unless the widths of the gaps Gap1, Gap2, and Gap3 match one another.

Table 1 shows examples of the resonant frequencies of the blades 111, 112, and 113 in the case where the widths of the gaps Gap1, Gap2, and Gap3 are different from one another. Table shows the resonant frequencies at each of which a corresponding one of the blades 111, 112, and 113 of the piezoelectric fan 10P of the related art can obtain a maximum amplitude.

TABLE 1

|  |  | Piezoelectric Fan 10P (Related Art) |
|---|---|---|
| Resonant Frequency [Hz] | Left Blade 112 | 65.5 |
|  | Middle Blade 111 | 68.5 |
|  | Right Blade 113 | 67.5 |

As shown in Table 1, in the case where the widths of the gaps Gap1, Gap2, and Gap3 are different from one another, and where the resonant frequencies of the blades 111, 112, and 113 are different from one another, when driving signals of the same frequency are applied to the blades 111, 112, and 113, the amplitudes of the blades 111, 112, and 113 are different from one another.

Table 2 shows examples of amplitudes of the blades 111, 112, and 113 in the case where the widths of the gaps Gap1, Gap2, and Gap3 are different from one another, and where driving signals of the same frequency are applied to the blades 111, 112, and 113. The frequency of an applied voltage is the average value of the resonant frequencies of the blades 111, 112, and 113. Note that the ratio of residual vibration shown in Table 2 is an index that indicates the ratio of the residual vibration that has not been canceled out to the average value of the amplitudes of the blades 111, 112, and 113. The specific method of calculating the ratio of residual vibration will be described later.

TABLE 2

|  | Piezoelectric Fan 10P (Related Art) |
|---|---|
| Frequency of Applied Voltage [Hz] | 67.0 |
| Amplitude [mm]   Left Blade 112 | 5.3 |
| Middle Blade 111 | 5.2 |
| Right Blade 113 | 5.9 |
| Average Amplitude [mm] | 5.4 |
| Ratio of Residual Vibration [%] | 3.7 |

As shown above, in the case where the amplitudes of the blades 111, 112, and 113 are different from one another, when propagating to the support bodies 141 and 142, the vibrations from the blades 111, 112, and 113 cannot cancel one another out, and the vibration in the support bodies 141, 142 cannot be suppressed.

Note that this phenomenon occurs not only in the case of a structure in which three blades are used but also in the case of a configuration in which a plurality of blades are used.

SUMMARY OF THE INVENTION

Accordingly, preferred embodiments of the present invention provide a piezoelectric fan capable of canceling vibrations of a plurality of blades out with certainty.

A piezoelectric fan according to a preferred embodiment of the present invention includes a vibrating plate that includes a plurality of blades, piezoelectric elements, and a support body. Each of the plurality of blades includes a flat plate, a first end of which is a free end. The piezoelectric elements are each mounted on the plurality of blades on at least one flat plate surface of the vibrating plate. The support body is mounted on the at least one flat plate surface of the vibrating plate on the side of a second end. In addition, the support body is mounted in such a manner that the piezoelectric elements, which are each mounted on a corresponding one of the plurality of blades, are sandwiched between the support body and the vibrating plate.

In this configuration, the piezoelectric elements, which are mounted on the corresponding blades, are sandwiched between the support body and the vibrating plate, and thus, unlike in the configuration of the related art, a gap will not be generated between an end surface of the support body and an end surface of each of the piezoelectric elements. As a result, the resonant frequencies of the blades match one another. Therefore, also in the case where driving signals of the same frequency are applied to the blades so as to drive the piezoelectric elements, the vibrations propagated to the support body cancel one another out with certainty.

It is preferable that the piezoelectric fan according to a preferred embodiment of the present invention have the following configuration. The number of the blades preferably is three, for example. The support body preferably is a flat plate that has an elongated shape, a longitudinal direction of which is one of directions that are perpendicular or substantially perpendicular to each other and a lateral direction of which is the other one of the directions. The three blades are arranged along the longitudinal direction of the support body. The piezoelectric fan further includes a driver configured to apply, to the piezoelectric elements, a driving signal that has a single frequency and that causes a middle blade among the three blades that is positioned in the middle in an array direction and side blades among the three blades that are positioned at either side in the array direction to vibrate with opposite phases.

This configuration shows a specific arrangement and a drive mechanism of the blades in the case where the number of blades is three, for example. With such a configuration, in a piezoelectric fan that includes three blades, vibration propagated from each of the blades to a support body is canceled out with certainty, and an occurrence of vibration at the support body (a fixed position) is prevented with certainty.

It is preferable that a piezoelectric fan according to a preferred embodiment of the present invention have the following configuration. The polarization direction of the piezoelectric element that is mounted on the middle blade and the polarization directions of the piezoelectric elements that are mounted on the side blades preferably are opposite to each other as seen from the side on which the piezoelectric elements are mounted on the corresponding blades.

In this configuration, driving signals that are to be applied to the piezoelectric elements are easily standardized, and a circuit configuration and a wiring pattern with which such driving signals are applied to the piezoelectric elements are simplified.

It is preferable that a piezoelectric fan according to a preferred embodiment of the present invention have the following configuration. The lengths of the three blades in a direction that is perpendicular or substantially perpendicular to the array direction are identical to one another. The length of the middle blade in the array direction is twice the length of each of the side blades in the array direction, for example.

This configuration shows a more specific structure of each of the three blades, and since the length (width) of the middle blade in the array direction is twice the length (width) of each of the side blades in the array direction, the cancellation effect is greatly improved. As a result, an occurrence of vibration at the support body (the fixed position) is prevented with more certainty.

In the piezoelectric fan according to a preferred embodiment of the present invention, it is preferable that an elastic body be disposed between the support body and the piezoelectric elements.

In this configuration, even if there are variations in thickness between the piezoelectric elements, the piezoelectric elements are sandwiched between the support body and the blades with certainty. As a result, an occurrence of vibration at the support body (the fixed position) is prevented with more certainty. In addition, the occurrence of breakage of the piezoelectric elements due to the support body is prevented.

In a piezoelectric fan according to a preferred embodiment of the present invention, it is preferable that the piezoelectric elements be mounted on both the flat plate surfaces of the vibrating plate.

In this configuration, each of the blades, which are included in the vibrating plate, defines and functions as a bimorph piezoelectric actuator. Therefore, each of the blades is configured to vibrate to a large extent by a driving signal that has the same amplitude compared with the case where each of the blades functions as a unimorph type piezoelectric actuator.

In a piezoelectric fan according to a preferred embodiment of the present invention, it is preferable that the support body is mounted on both the flat plate surfaces of the vibrating plate.

In this configuration, the vibrating plate is more strongly fixed in place. In particular, in the case where the piezoelectric elements are mounted on the two surfaces, the piezoelectric elements on the two surfaces of each of the blades are sandwiched, and thus, the occurrence of vibration at the support body (the fixed position) is prevented with more certainty while a large amplitude is obtained.

According to various preferred embodiments of the present invention, vibrations of a plurality of blades that are included in a piezoelectric fan cancel one another out with certainty.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A-6C include a plan view, a side view, and a rear view of a piezoelectric fan 10B according to a third preferred embodiment of the present invention.

DETAILED DESCRIPTION OF THE PREFERRED EMBODIMENTS

Figure 1:
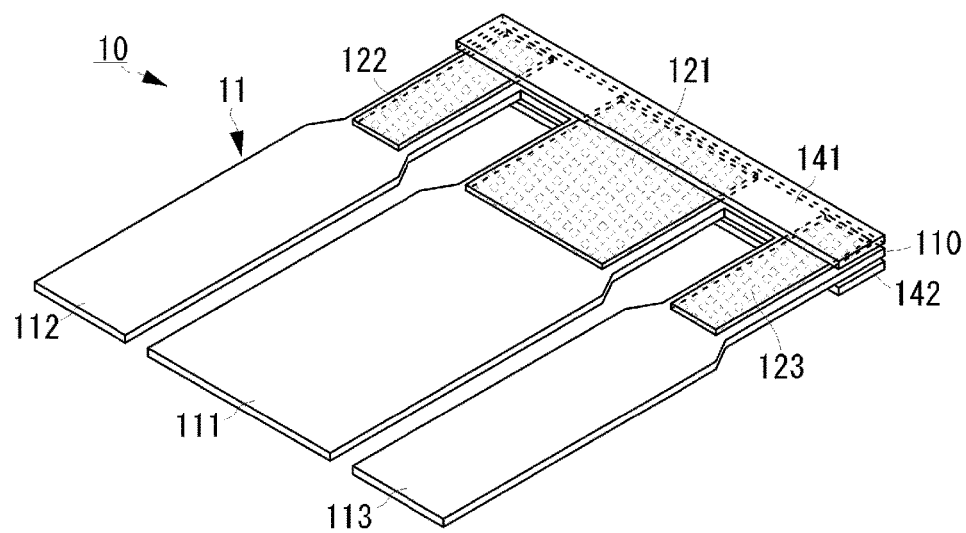
FIG. 1 is an external perspective view of a piezoelectric fan 10 according to a first preferred embodiment of the present invention.
Figure 2:
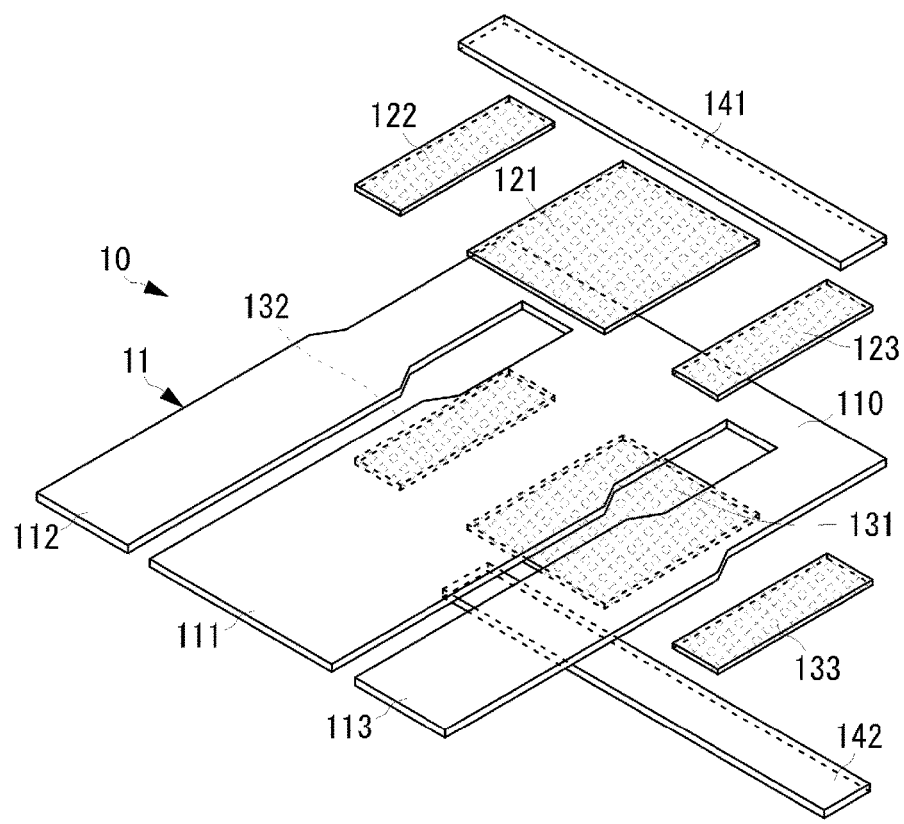
FIG. 2 is an exploded perspective view of the piezoelectric fan 10 according to the first preferred embodiment of the present invention.
Figure 3A:
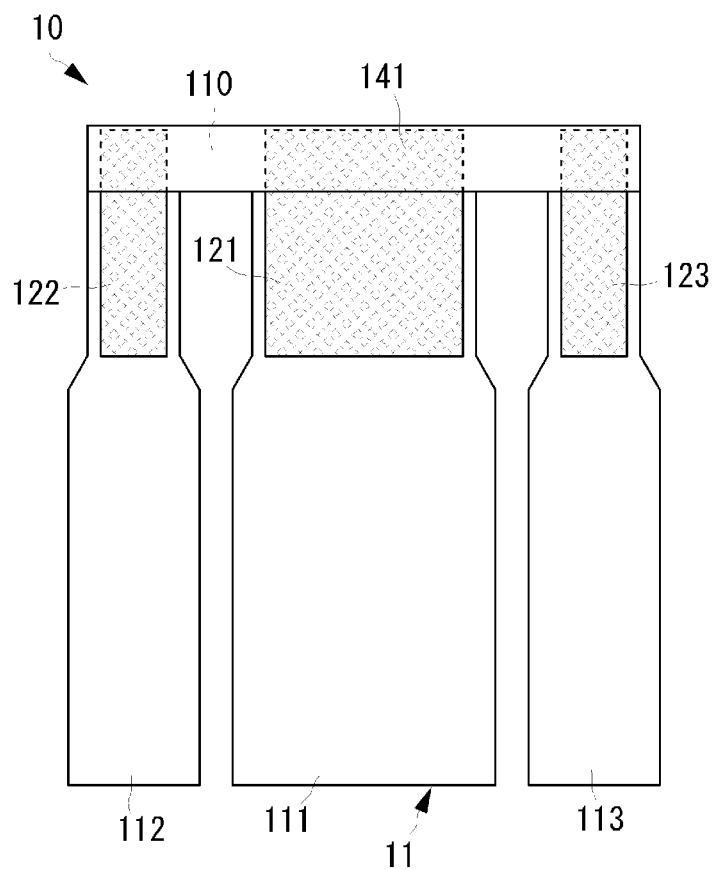
FIGS. 3A-3C include a plan view, a side view, and a front view of the piezoelectric fan 10 according to the first preferred embodiment of the present invention.
Figure 3B:
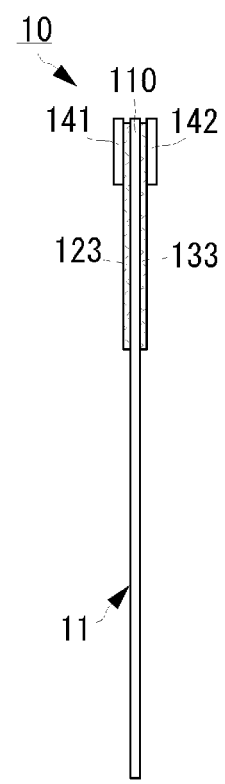
Figure 3C:
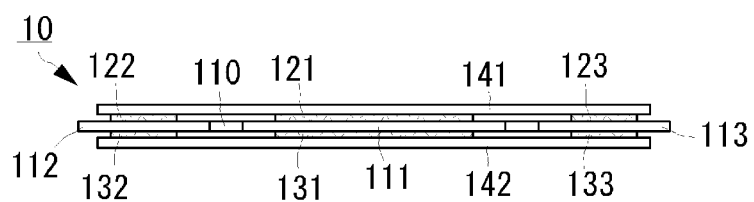

A piezoelectric fan according to a first preferred embodiment of the present invention will be described with reference to the drawings. FIG. 1 is an external perspective view of a piezoelectric fan 10 according to the first preferred embodiment of the present invention. FIG. 2 is an exploded perspective view of the piezoelectric fan 10 according to the first preferred embodiment of the present invention. FIG. 3A is a plan view of the piezoelectric fan 10 according to the first preferred embodiment of the present invention (a diagram as seen from the side of a first flat plate surface). FIG. 3B is a side view of the piezoelectric fan 10 according to the first preferred embodiment of the present invention (as seen from a direction that is parallel to an array direction of blades 111, 112, and 113). FIG. 3C is a front view of the piezoelectric fan according to the first preferred embodiment of the present invention (a diagram as seen from the side of a free end of a vibrating plate 11).

The piezoelectric fan 10 includes the vibrating plate 11, piezoelectric elements 121, 122, 123, 131, 132, and 133, and support bodies 141 and 142.

The vibrating plate 11 includes a flat plate that has a predetermined rigidity. For example, the vibrating plate 11 is preferably formed of a stainless steel flat plate that has a thickness of about 0.1 mm.

The vibrating plate 11 preferably includes the three blades 111, 112, and 113 and a base 110 that are integrally formed so as to define a unitary member. Each of the blades 111, 112, and 113 and the base 110 has an elongated shape. The blades 111, 112, and 113 are connected to the base 110 so as to be arranged at a predetermined pitch along the longitudinal direction of the base 110. In this case, the blades 111, 112, and 113 are connected to the base 110 so as to be arranged along the longitudinal direction of the base 110 in the order of the blade 112, the blade 111, and the blade 113.

Each of the blades 111, 112, and 113 is connected to the base 110 such that the longitudinal direction thereof is perpendicular or substantially perpendicular to the longitudinal direction of the base 110, that is, the array direction of the blades 111, 112, and 113. As a result, an end of each of the blades 111, 112, and 113 that is connected to the base 110 is a fixed end. On the other hand, an end of each of the blades 111, 112, and 113 that is on the opposite side to the corresponding fixed end in the longitudinal direction is a free end.

Each of the blades 111, 112, and 113 has a shape in which the width (the length in the array direction) changes at a predetermined position in the longitudinal direction. More specifically, the width of an area that has a predetermined length on the side of the fixed end of each of the blades 111, 112, and 113 is smaller (narrower) than the width of an area that has a predetermined length on the side of the free end of each of the blades 111, 112, and 113.

The blades 112 and 113, which are positioned at either side, preferably have the same shape or substantially the same shape. The width of the blade 111, which is positioned in the middle, in the array direction preferably is about twice the width of each of the blades 112 and 113, which are positioned at either side, in the array direction, for example.

The piezoelectric element 121 is mounted on the first flat plate surface of the blade 111. The piezoelectric element 121 preferably has a flat plate-shaped configuration and is a piezoelectric element that is polarized in a direction that is perpendicular or substantially perpendicular to opposing flat plate surfaces of the piezoelectric element. The piezoelectric element 121 is mounted such that the flat plate surfaces thereof are parallel or substantially parallel to the first flat plate surface of the blade 111. The piezoelectric element 121 is mounted so as to cover a region that has a predetermined area and that extends from an area in the blade 111 on the side of the fixed end of the blade 111 to the base 110. The piezoelectric element 121 has a shape that is long in a direction that is parallel or substantially parallel to the longitudinal direction of the blade 111 (this direction is hereinafter referred to as the length direction of the piezoelectric element 121) and is short in the width direction of the blade 111 (this direction is hereinafter referred to as the width direction of the piezoelectric element 121). An electrode (not illustrated) that allows application of a driving signal is provided on a surface of the piezoelectric element 121 that is in contact with the first flat plate surface of the blade 111, and its opposite flat plate surface of the piezoelectric element 121.

The piezoelectric element 131 is mounted on a second flat plate surface (a surface on the opposite side to the first flat plate surface) of the blade 111. The piezoelectric element 131 preferably has a flat plate-shaped configuration and is a piezoelectric element that is polarized in a direction that is perpendicular or substantially perpendicular to opposing flat plate surfaces of the piezoelectric element. The piezoelectric element 131 is mounted such that the flat plate surfaces thereof are parallel or substantially parallel to the second flat plate surface of the blade 111, which is positioned in the middle. The piezoelectric element 131 is mounted so as to cover a region that has a predetermined area and that extends from an area in the blade 111, which is positioned in the middle, on the side of the fixed end of the blade 111 to the base 110. The piezoelectric element 121 and the piezoelectric element 131 preferably have the same shape or substantially the same shape such that the flat plate surfaces of the piezoelectric element 121 and the piezoelectric element 131 face each other. An electrode (not illustrated) that allows application of a driving signal is provided on a surface of the piezoelectric element 131 that is in contact with the second flat plate surface of the blade 111, and its opposite flat plate surface of the piezoelectric element 131.

The piezoelectric element 122 is mounted on a first flat plate surface of the blade 112. The piezoelectric element 122 preferably has a flat plate-shaped configuration and is a piezoelectric element that is polarized in a direction that is perpendicular to opposing flat plate surfaces of the piezoelectric element. The piezoelectric element 122 is mounted such that the flat plate surfaces thereof are parallel or substantially parallel to the first flat plate surface of the blade 112. The piezoelectric element 122 is mounted so as to cover a region that has a predetermined area and that extends from an area in the blade 112 on the side of the fixed end of the blade 112 to the base 110. The length of the piezoelectric element 122 (the length in a direction that is parallel to the longitudinal direction of the blade 112) is the same or substantially the same as the length of the piezoelectric element 121. The width of the piezoelectric element 122 is about half of the width of the piezoelectric element 121. An electrode (not illustrated) that allows application of a driving signal is provided on a surface of the piezoelectric element 122 that is in contact with the first flat plate surface of the blade 112, and its opposite flat plate surface of the piezoelectric element 122.

The piezoelectric element 132 is mounted on a second flat plate surface (a surface on the opposite side to the first flat plate surface) of the blade 112. The piezoelectric element 132 preferably has a flat plate-shaped configuration and is a piezoelectric element that is polarized in a direction that is perpendicular or substantially perpendicular to opposing flat plate surfaces of the piezoelectric element. The piezoelectric element 132 is mounted such that the flat plate surfaces thereof are parallel or substantially parallel to the second flat plate surface of the blade 112. The piezoelectric element 132 is mounted so as to cover a region that has a predetermined area and that extends from an area in the blade 112 on the side of the fixed end of the blade 112 to the base 110. The piezoelectric element 122 and the piezoelectric element 132 preferably have the same or substantially the same shape and are arranged such that the flat plate surfaces of the piezoelectric element 122 and the piezoelectric element 132 face each other. An electrode (not illustrated) that allows application of a driving signal is provided on the flat plate surface of the piezoelectric element 132 on the opposite side to the surface of the piezoelectric element 132 that is in contact with the second flat plate surface of the blade 112.

The piezoelectric element 123 is mounted on a first flat plate surface of the blade 113. The piezoelectric element 123 preferably has a flat plate-shaped configuration and is a piezoelectric element that is polarized in a direction that is perpendicular or substantially perpendicular to opposing flat plate surfaces of the piezoelectric element. The piezoelectric element 123 is mounted such that the flat plate surfaces thereof are parallel or substantially parallel to the first flat plate surface of the blade 113. The piezoelectric element 123 is mounted so as to cover a region that has a predetermined area and that extends from an area in the blade 113 on the side of the fixed end of the blade 113 to the base 110. The piezoelectric element 123 preferably has the same or substantially the same shape as that of the piezoelectric element 122. An electrode (not illustrated) that allows application of a driving signal is provided on a surface of the piezoelectric element 123 that is in contact with the first flat plate surface of the blade 113, and its opposite flat plate surface of the piezoelectric element 123.

The piezoelectric element 133 is mounted on a second flat plate surface (a surface on the opposite side to the first flat plate surface) of the blade 113. The piezoelectric element 133 preferably has a flat plate-shaped configuration and is a piezoelectric element that is polarized in a direction that is perpendicular or substantially perpendicular to opposing flat plate surfaces of the piezoelectric element. The piezoelectric element 133 is mounted such that the flat plate surfaces thereof are parallel or substantially parallel to the second flat plate surface of the blade 113. The piezoelectric element 133 is mounted so as to cover a region that has a predetermined area and that extends from an area in the blade 113 on the side of the fixed end of the blade 113 to the base 110. The piezoelectric element 123 and the piezoelectric element 133 preferably have the same or substantially the same shape and are arranged such that the flat plate surfaces of the piezoelectric element 123 and the piezoelectric element 133 face each other. An electrode (not illustrated) that allows application of a driving signal is provided on a surface of the piezoelectric element 133 that is in contact with the second flat plate surface of the blade 113, and its opposite flat plate surface of the piezoelectric element 133.

Each of the piezoelectric elements 121, 122, 123, 131, 132, and 133 preferably includes, for example, a piezoelectric body that is made of a PZT-based ceramic and that includes two main surfaces on each of which an electrode is provided. Note that an electrode that is to be provided on the vibrating plate can be omitted by using an electric conductor as the vibrating plate 11.

The support bodies 141 and 142 are mounted on the vibrating plate 11 on which the piezoelectric elements 121, 122, 123, 131, 132, and 133 have been mounted as described above.

Each of the support bodies 141 and 142 preferably includes a flat plate that has an elongated shape, which is the same or substantially the same as that of the base 110 of the vibrating plate 11. Each of the support bodies 141 and 142 is made of, for example, an insulating material such as a glass epoxy resin.

The support body 141 is mounted on the surface of the base 110 of the vibrating plate 11 on which the piezoelectric elements 121, 122, and 123 have been mounted. In this case, the support body 141 is mounted so as to extend across a plurality of the blades such that the piezoelectric elements 121, 122, and 123 are sandwiched between the support body 141 and the base 110 and that the array direction of the blades 111, 112, and 113 and the longitudinal direction of the support body 141 match or substantially match each other.

The support body 142 is mounted on the surface of the base 110 of the vibrating plate 11 on which the piezoelectric elements 131, 132, and 133 have been mounted. In this case, the support body 142 is mounted such that the piezoelectric elements 131, 132, and 133 are sandwiched between the base 110 and the support body 142.

Figure 4A:
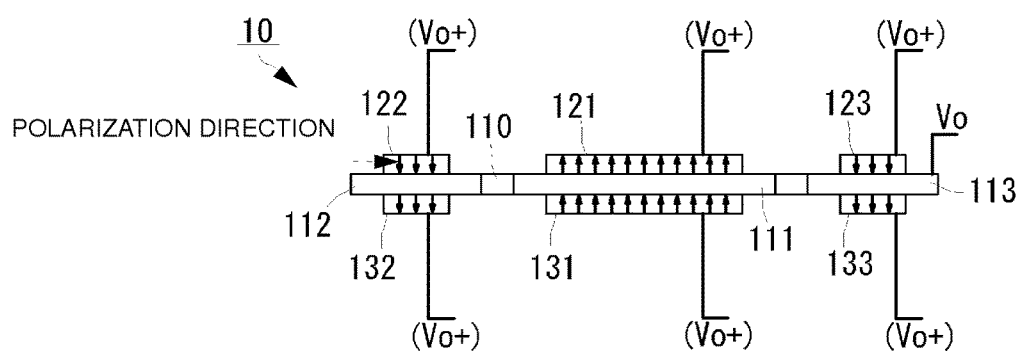
FIGS. 4A and 4B are conceptual diagrams illustrating driving of the piezoelectric fan 10 according to the first preferred embodiment of the present invention.
Figure 4B:
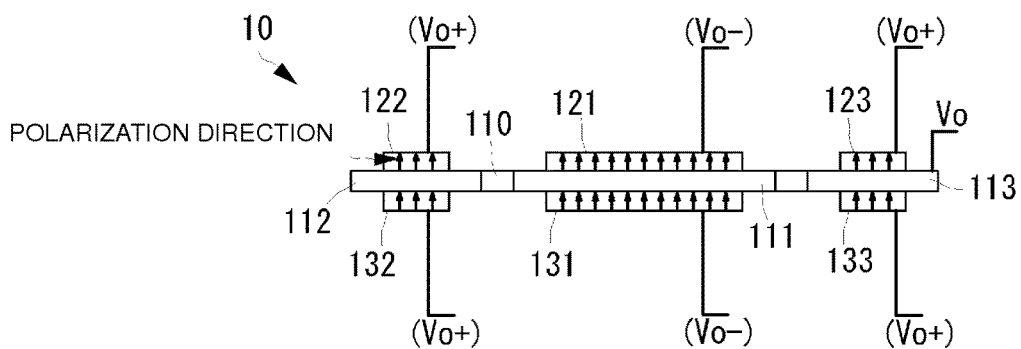

A drive voltage is applied to the piezoelectric elements 121, 122, 123, 131, 132, and 133 of the piezoelectric fan 10, which has a structure such that, under the following conditions, the blades 111, 112, and 113 vibrate in a direction that is perpendicular or substantially perpendicular to the flat plate surfaces thereof. FIGS. 4A and 4B are conceptual diagrams illustrating driving of the piezoelectric fan 10 according to the first preferred embodiment of the present invention. FIG. 4A illustrates a first driver, and FIG. 4B illustrates a second driver.

More specifically, as illustrated in FIG. 4A, in the first driver, the polarization direction of the piezoelectric element 121 and the polarization directions of the piezoelectric elements 122 and 123 are set to be opposite to each other when the vibrating plate 11 is seen from the front. Similarly, the polarization direction of the piezoelectric element 131 and the polarization directions of the piezoelectric elements 132 and 133 are set to be opposite to each other when the vibrating plate 11 is seen from the front. In addition, the polarization direction of the piezoelectric element 121 and the polarization direction of the piezoelectric element 131 are set to be the same as each other when the vibrating plate 11 is seen from the front. In this state, as illustrated in FIG. 4A, alternating voltages that are to be applied to the piezoelectric elements 121, 122, 123, 131, 132, and 133 are set to have the same phase. By using this first driver, the same driving signal is applied to all the piezoelectric elements that are mounted on the vibrating plate 11, and thus, an application circuit for the driving signal and a connection configuration is greatly simplified.

As illustrated in FIG. 4B, in the second driver, the polarization directions of all the piezoelectric elements 121, 122, 123, 131, 132, and 133 are set to be the same as one another when the vibrating plate 11 is seen from the front. In this state, as illustrated in FIG. 4B, the vibrating plate 11 is set to have a reference voltage Vo, and an alternating voltage that is to be applied to the piezoelectric elements 121 and 131 and an alternating voltage that is to be applied to the piezoelectric elements 122, 123, 132, and 133 are set to have opposite phases.

By using such drivers, the vibration of the blade 111 and the vibrations of the blades 112 and 113 have opposite phases. Here, since the width of the blade 111 is twice the width of each of the blades 112 and 113, the vibration that occurs in the blade 111 and the sum of the vibrations that occur in the blade 112 and the blade 113 have the same degree and opposite phases. Therefore, the vibration that occurs in the blade 111 and the sum of the vibrations that occur in the blade 112 the blade 113 cancel each other out at the position at which the base 110 and the support bodies 141 and 142 are disposed.

Here, in the configuration of the present preferred embodiment, as described above, a gap will not be generated between the end surface of each of the piezoelectric elements 121, 122, and 123 and the end surface of the support body 141. In addition, a gap will not be generated between the end surface of each of the piezoelectric elements 131, 132, and 133 and the end surface of the support body 142. Therefore, the resonant frequencies of the blades 111, 112, and 113 are the same as one another.

Table 3 shows examples of the resonant frequencies of the blades 111, 112, and 113 of the piezoelectric fan 10, which has the configuration of the present preferred embodiment. Table 3 shows the resonant frequencies at each of which a corresponding one of the blades 111, 112, and 113 of the piezoelectric fan 10 can obtain a maximum amplitude. Note that Table 3 also shows the above-described results related to the piezoelectric fan 10P shown in Table 1.

TABLE 3

| | | Piezoelectric Fan 10 (Present Application) | Piezoelectric Fan 10P (Related Art) |
|---|---|---|---|
| Resonant Frequency [Hz] | Left Blade 112 | 70.4 | 65.5 |
| | Middle Blade 111 | 70.6 | 68.5 |
| | Right Blade 113 | 70.7 | 67.5 |

As shown in Table 3, with the configuration of the present preferred embodiment, the resonant frequencies of the blade 111, the blade 112, and the blade 113 preferably are approximately 70.6 Hz, 70.4 Hz, and 70.7 Hz, respectively, and substantially match one another, for example. On the other hand, with the configuration of the related art, the resonant frequencies of the blade 111, the blade 112, and the blade 113 preferably are approximately 68.5 Hz, 65.5 Hz, and 67.5 Hz, respectively, and there are variations in size thereamong, for example.

Table 4 shows examples of the amplitudes of the blades 111, 112, and 113 in the case where driving signals of the same frequency are applied to the blades 111, 112, and 113. The frequency of an applied voltage is the average value of the resonant frequencies of the blades 111, 112, and 113. Note that Table 4 also shows the above-described results related to the piezoelectric fan 10P shown in Table 2.

The ratio of residual vibration shown in Table 4 is an index that indicates the ratio of the residual vibration that has not been canceled out to the average value of the amplitudes of the blades 111, 112, and 113. More specifically, the ratio of residual vibration is a value that is obtained by subtracting the amplitudes of the blades 112 and 113 from a value twice as large as the amplitude of the blade 111 and dividing the calculated value by a value four times as large as the average value of the amplitudes of the blades 111, 112, and 113.

This can be expressed by the following formula.

(2×(amplitude of blade 111))−(amplitude of blade 112)−(amplitude of blade 113)/(4×(average value of amplitudes of blades 111,112, and 113))

Thus, the smaller the index value, the higher the effect of suppressing vibration.

TABLE 4

| | | Piezoelectric Fan 10 (Present Application) | Piezoelectric Fan 10P (Related Art) |
|---|---|---|---|
| Frequency of Applied Voltage [Hz] | | 70.6 | 67.0 |
| Amplitude [mm] | Left Blade 112 | 5.9 | 5.3 |
| | Middle Blade 111 | 6.1 | 5.2 |
| | Right Blade 113 | 6.0 | 5.9 |
| Average Amplitude [mm] | | 6.0 | 5.4 |
| Ratio of Residual Vibration [%] | | 1.2 | 3.7 |

As shown in Table 4, with the configuration of the present preferred embodiment, the amplitudes of the blade 111, the blade 112, and the blade 113 preferably are about 6.1 mm, about 5.9 mm, and about 6.0 mm, respectively, and substantially match one another, for example. On the other hand, with the configuration of the related art, the amplitudes of the blade 111, the blade 112, and the blade 113 are 5.2 mm, 5.3 mm, and 5.9 mm, respectively, and there are significant variations in size thereamong.

With the configuration of the present preferred embodiment, the ratio of residual vibration is about 1.2%, for example. On the other hand, with the configuration of the related art, the ratio of residual vibration is 3.7%. As seen from the results, with the configuration of the present preferred embodiment, the effect of suppressing vibration is greatly improved.

Figure 5C:
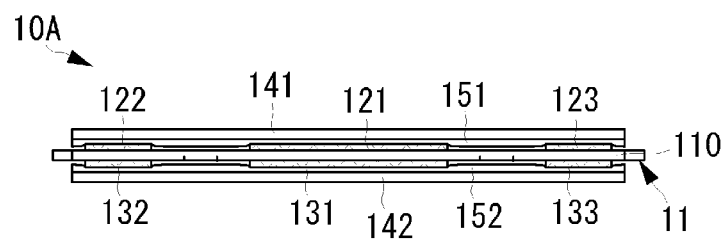
FIGS. 5A-5C include a plan view, a side view, and a rear view of a piezoelectric fan 10A according to a second preferred embodiment of the present invention.
Figure 5A:
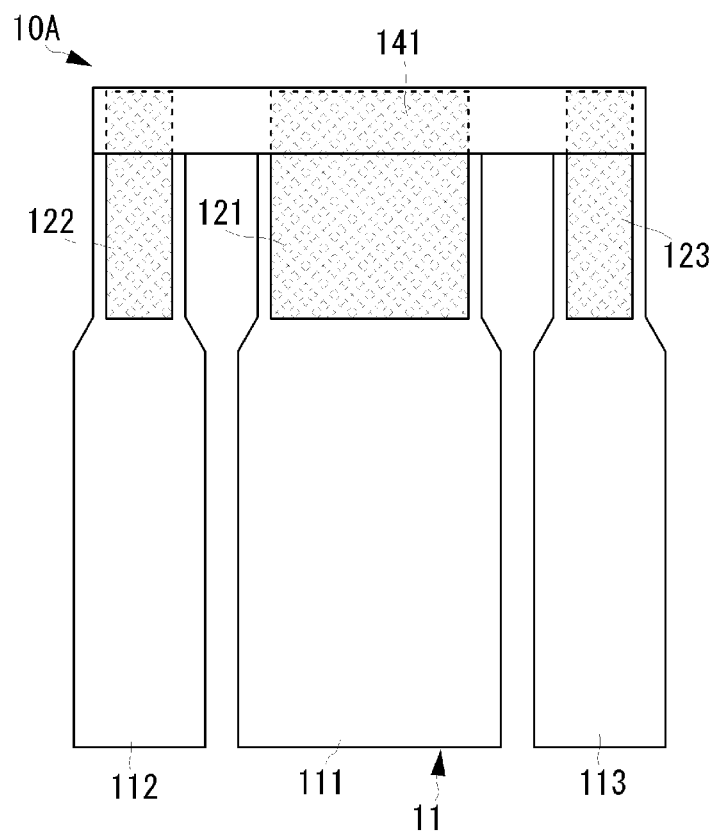
Figure 5B:
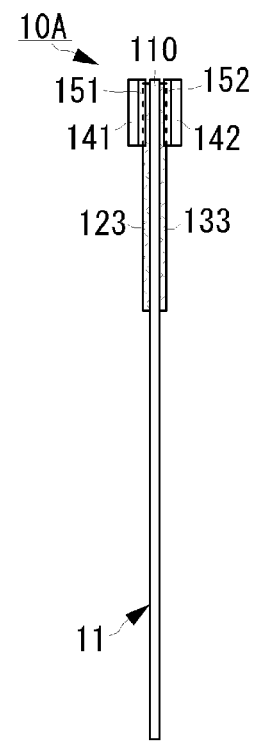
Figure 7A:
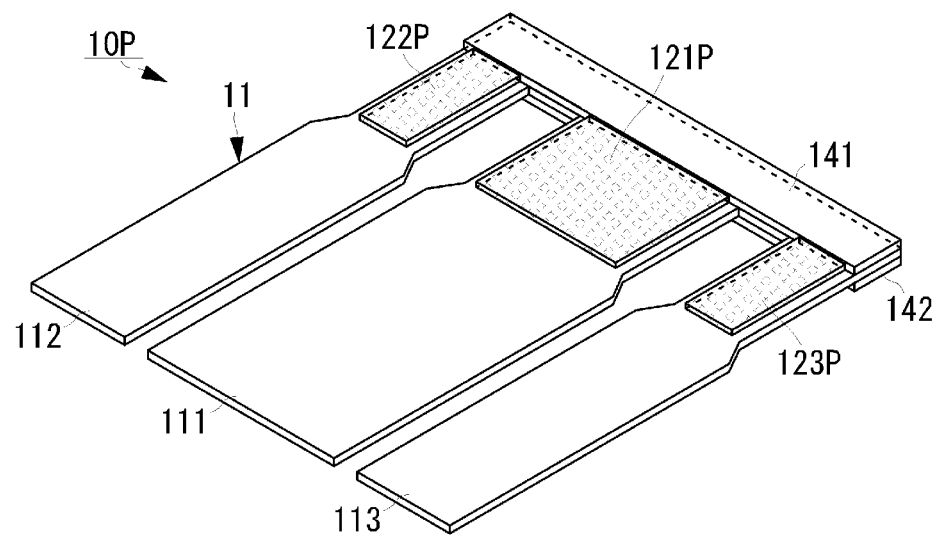
FIGS. 7A-7C include an external perspective view, a plan view, and a side view of a piezoelectric fan 10P of the related art described in Japanese Unexamined Utility Model Registration Application Publication No. 3-35298.
Figure 7B:
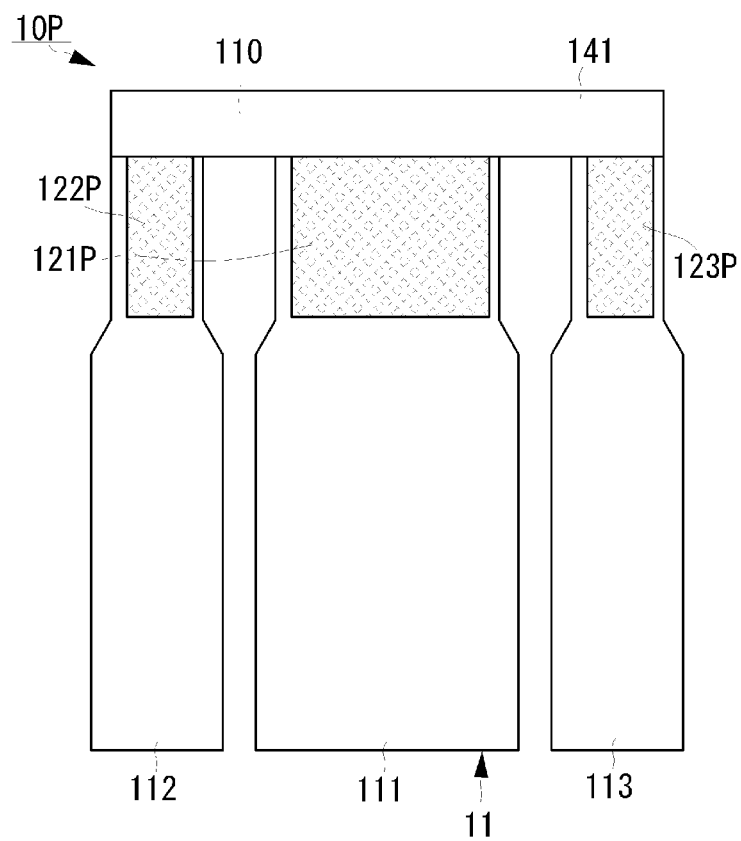
Figure 7C:
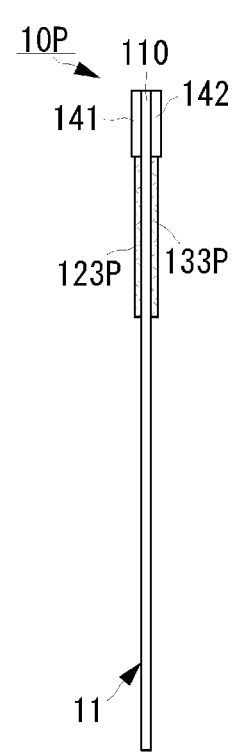
Figure 8:
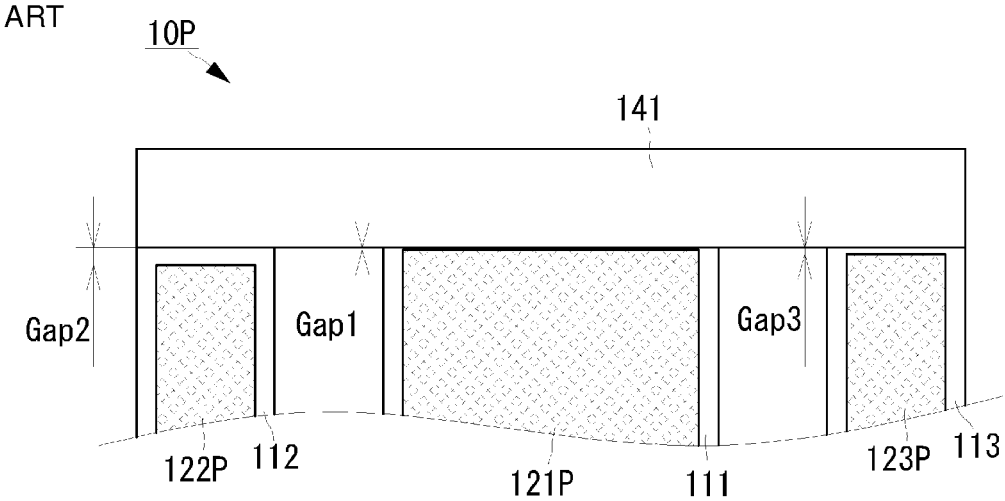
FIG. 8 is an enlarged plan view for describing problems concerning the piezoelectric fan 10P, which has the configuration described in Japanese Unexamined Utility Model Registration Application Publication No. 3-35298.

A piezoelectric fan according to a second preferred embodiment of the present invention will now be described with reference to the drawings. FIG. 5A is a plan view of a piezoelectric fan 10A according to the second preferred embodiment of the present invention. FIG. 5B is a side view of the piezoelectric fan 10A according to the second preferred embodiment of the present invention. FIG. 5C is a rear view of the piezoelectric fan 10A according to the second preferred embodiment of the present invention (a diagram as seen from the side of the fixed end of the vibrating plate 11).

The piezoelectric fan 10A of the present preferred embodiment is configured by adding elastic bodies 151 and 152 to the piezoelectric fan 10 of the first preferred embodiment, and the rest of the configuration of the piezoelectric fan 10A preferably is the same or substantially the same as that of the piezoelectric fan 10. Thus, only a difference between the piezoelectric fan 10A and the piezoelectric fan 10 will be described.

Each of the elastic bodies 151 and 152 preferably has a flat film-shaped configuration and is made of, for example, rubber or the like that has an insulating property.

The elastic body 151 is sandwiched between the base 110 on which the piezoelectric elements 121, 122, and 123 have been mounted and the support body 141.

The elastic body 152 is sandwiched between the base 110 on which the piezoelectric elements 131, 132, and 133 have been mounted and the support body 142.

With such a configuration, the vibrating plate 11 is held by the support body 141 with certainty even if there are variations in thickness between the piezoelectric elements 121, 122, and 123. In addition, the vibrating plate 11 is held by the support body 142 with certainty even if there are variations in thickness between the piezoelectric elements 131, 132, and 133. Furthermore, the vibrating plate 11 is strongly sandwiched and held by the support bodies 141 and 142 with certainty even if there are variations in thickness between the piezoelectric elements 121, 122, 123, 131, 132, and 133. As a result, the above-described vibration cancelling effect is greatly improved.

A piezoelectric fan according to a third preferred embodiment of the present invention will now be described with reference to the drawings. FIG. 6A is a plan view of a piezoelectric fan 10B according to the third preferred embodiment of the present invention. FIG. 6B is a side view of the piezoelectric fan 10B according to the third preferred embodiment of the present invention. FIG. 6C is a rear view of the piezoelectric fan 10B according to the third preferred embodiment of the present invention (a diagram as seen from the side of the fixed end of a vibrating plate 11B).

In the piezoelectric fan 10B of the present preferred embodiment, a difference from the piezoelectric fan 10A of the second preferred embodiment is that the configuration of the vibrating plate 11B is different from that of the vibrating plate 11, and the rest of the configuration of the piezoelectric fan 10B preferably is the same or substantially the same as that of the piezoelectric fan 10A. Thus, only the difference will be described.

The vibrating plate 11B includes blades 111B, 112B, and 113B that are individually provided and separate elements from each other. The blade 111B has a configuration in which the blade 111 of the first preferred embodiment and a portion of the base 110 that extends from the blade 111 in the longitudinal direction are integral with each other so as to define a unitary member. The blade 112B has a configuration in which the blade 112 of the first preferred embodiment and a portion of the base 110 that extends from the blade 112 in the longitudinal direction are integral with each other so as to define a unitary member. The blade 113B has a configuration in which the blade 113 of the first preferred embodiment and a portion of the base 110 that extends from the blade 113 in the longitudinal direction are integral with each other so as to define a unitary member.

Even with such a configuration, advantageous effects similar to those of the second preferred embodiment are obtained. Note that the configuration of the third preferred embodiment preferably is applied to a shape that has the configuration of the first preferred embodiment, that is, a shape in which the elastic bodies 151 and 152 are omitted.

Although the number of blades that are included in the vibrating plate preferably is three in the above-described preferred embodiments, the number of blades is not limited to this as long as a structure in which vibrations that occur on the side of fixed ends are caused to cancel one another out by a driving signal that is to be applied is used.

In addition, although, in the above-described preferred embodiments, the case of a bimorph type piezoelectric fan in which a piezoelectric element is mounted on the two flat plate surfaces of a vibrating plate has been described as an example, preferred embodiments of the present invention are applicable to a unimorph type piezoelectric fan in which a piezoelectric element is mounted on one flat plate surface of a vibrating plate. Note that in the case of a unimorph type piezoelectric fan, a support body need not be mounted on the flat plate surface of a vibrating plate on which a piezoelectric element is not mounted. However, in a bimorph type piezoelectric fan, blades vibrate to a large extent compared with in a unimorph type piezoelectric fan. It is further preferable to use the configuration of the present preferred embodiment because the effect of significantly reducing or preventing vibration propagated to a support body is achieved even in the case where such a large vibration is obtained.

Although each of the piezoelectric elements is preferably made of, for example, a PZT-based ceramic in the above-described preferred embodiments, the material out of which the piezoelectric elements are made is not limited to this. The piezoelectric elements may be made of, for example, a piezoelectric material of non-lead-based piezoelectric ceramics such as potassium-sodium niobate-based and alkali niobate-based ceramics.

Although not particularly described in detail in the above description, the above-described advantageous effects are achieved as long as a configuration in which all the piezoelectric elements are sandwiched between the support body and the vibrating plate is used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric fan comprising:
   a vibrating plate that includes a base and a plurality of blades, each of which is defined by a flat plate, a first end of which is a free end, each flat plate including flat plate surfaces that are opposed to each other;

a plurality of piezoelectric elements that are mounted on the plurality of blades on at least one of the flat plate surfaces of the vibrating plate; and support bodies that are mounted on both of the flat plate surfaces of the vibrating plate on a side of a second end opposite to the first end; wherein the support bodies are mounted so as to extend across all of the plurality of blades such that the plurality of piezoelectric elements, which are mounted on the plurality of blades, are sandwiched between the support bodies and the base;

the support bodies are mounted on every one of the plurality of piezoelectric elements that are mounted on the at least one surface of the plurality of blades;

each of the plurality of blades is connected to the base such that a longitudinal direction of the plurality of blades is perpendicular or substantially perpendicular to a longitudinal direction of the base;

the plurality of piezoelectric elements are mounted on the plurality of blades and the base; and the support bodies are not in contact with the plurality of piezoelectric elements or the vibrating plate in a portion of the support bodies that extends along a portion of the base extending between adjacent ones of the plurality of blades.

2. The piezoelectric fan according to claim 1, wherein a number of the blades is three.

3. The piezoelectric fan according to claim 2, wherein each of the support bodies is a flat plate that has an elongated shape, a longitudinal direction of which is one of directions that are perpendicular or substantially perpendicular to each other and a lateral direction of which is the other one of the directions.

4. The piezoelectric fan according to claim 3, wherein the three blades are arranged along the longitudinal direction of the support bodies.

5. The piezoelectric fan according to claim 4, wherein the piezoelectric fan further comprises a driver configured to apply, to the piezoelectric elements, a driving signal that has a single frequency and to cause a middle blade among the three blades that is positioned in a middle in an array direction and side blades among the three blades that are positioned at either side in the array direction to vibrate with opposite phases.

6. The piezoelectric fan according to claim 5, wherein a polarization direction of the piezoelectric element that is mounted on the middle blade and polarization directions of the piezoelectric elements that are mounted on the side blades are opposite to each other as seen from a side on which the piezoelectric elements are mounted on the corresponding blades.

7. The piezoelectric fan according to claim 5, wherein lengths of the three blades in a direction that is perpendicular or substantially perpendicular to the array direction are identical to one another; and the length of the middle blade in the array direction is twice the length of each of the side blades in the array direction.

8. The piezoelectric fan according to claim 1, wherein an elastic body is disposed between the support bodies and the piezoelectric elements.

9. The piezoelectric fan according to claim 1, wherein the piezoelectric elements are mounted on both of the flat plate surfaces of the vibrating plate.

10. The piezoelectric fan according to claim 1, wherein the flat plate is made of stainless steel.

11. The piezoelectric fan according to claim 1, wherein a number of the blades is three and a width of a middle blade is about twice a width of each of the blades located on either side of the middle blade.

12. The piezoelectric fan according to claim 1, wherein the piezoelectric elements include flat plate surfaces mounted parallel or substantially parallel to the flat plate surfaces of the vibrating plate.

13. The piezoelectric fan according to claim 1, wherein a number of the piezoelectric elements is three and a width of a middle piezoelectric element is about twice a width of each of the piezoelectric element located on either side of the middle piezoelectric element.

14. The piezoelectric fan according to claim 5, wherein the blades are configured such that vibration of the middle blade and a sum of vibrations of the side blades cancel each other out.

15. The piezoelectric fan according to claim 1, wherein the blades are configured such that resonant frequencies of the blades are the same or substantially the same as each other.

16. The piezoelectric fan according to claim 1, wherein the base is integral with each of the blades.

17. The piezoelectric fan according to claim 1, wherein the piezoelectric fan is one of a unimorph fan and a bimorph fan.

* * * * *